(12) United States Patent
Takeshita

(10) Patent No.: US 11,105,860 B2
(45) Date of Patent: Aug. 31, 2021

(54) BATTERY MONITORING DEVICE AND BATTERY MONITORING SYSTEM

(71) Applicant: LAPIS Semiconductor CO., LTD., Yokohama (JP)

(72) Inventor: Koji Takeshita, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 407 days.

(21) Appl. No.: 16/128,532

(22) Filed: Sep. 12, 2018

(65) Prior Publication Data

US 2019/0086475 A1 Mar. 21, 2019

(30) Foreign Application Priority Data

Sep. 15, 2017 (JP) .............................. JP2017-177896

(51) Int. Cl.
| | | |
|---|---|---|
| *H02J 7/00* | (2006.01) | |
| *G01R 31/3835* | (2019.01) | |
| *H03K 21/40* | (2006.01) | |
| *G01R 31/396* | (2019.01) | |
| *G01R 31/392* | (2019.01) | |

(52) U.S. Cl.
CPC ....... *G01R 31/3835* (2019.01); *G01R 31/392* (2019.01); *G01R 31/396* (2019.01); *H03K 21/40* (2013.01)

(58) Field of Classification Search
CPC .................................................. G01R 31/3835
USPC ........................................................ 320/116
See application file for complete search history.

(56) References Cited

U.S. PATENT DOCUMENTS

| | | | | |
|---|---|---|---|---|
| 6,133,709 A * | 10/2000 | Puchianu | ................ | B60L 58/12 320/116 |
| 7,528,581 B2 * | 5/2009 | Miyazaki | .............. | H02J 7/0019 320/163 |
| 7,800,342 B2 * | 9/2010 | Kobayashi | ............ | H02J 7/0019 320/118 |
| 8,860,422 B2 * | 10/2014 | Butzmann | ............. | H02J 7/0021 324/433 |
| 8,908,779 B2 | 12/2014 | Douglass | | |
| 2014/0191765 A1 * | 7/2014 | Takeshita | ................ | B60L 58/18 324/434 |
| 2014/0266051 A1 * | 9/2014 | Hayakawa | ............ | H02J 7/0018 320/118 |

FOREIGN PATENT DOCUMENTS

JP 2013083514 5/2013

* cited by examiner

*Primary Examiner* — Yalkew Fantu
(74) *Attorney, Agent, or Firm* — JCIPRNET

(57) ABSTRACT

A battery monitoring device and a battery monitoring system for suppressing a variation of a pulse width in a communication signal transmitted and received between battery monitoring devices are provided. The battery monitoring device comprises: a receiving unit, which receives a communication signal input from the outside; a signal regenerating unit, which regenerates the communication signal so that a width of a pulse that is included in the communication signal received by the receiving unit becomes a prescribed magnitude; a transmitting unit, which transmits the communication signal regenerated by the signal regenerating unit to the outside; and a processing unit, which carries out a process of measuring a cell voltage of battery cells according to the communication signal received by the receiving unit.

12 Claims, 12 Drawing Sheets

BATTERY MONITORING DEVICE AND BATTERY MONITORING SYSTEM

CROSS-REFERENCE TO RELATED APPLICATION

This application claims the benefit of Japan Application No. 2017-177896, filed on Sep. 15, 2017. The entirety of the above-mentioned patent application is hereby incorporated by reference herein and made a part of this specification.

BACKGROUND

Technical Field

The present disclosure relates to a battery monitoring device and a battery monitoring system.

Related Art

An assembled battery in which multiple battery cells are connected in series is commonly used as a large-capacity and high-output battery which is used for a motor drive and the like of hybrid automobiles or electric automobiles. Such battery cells may be, for example, a lithium-ion secondary battery. Such battery cells have a high energy density, so that there is concern that the energy would be released at once when an internal short circuit or the like occurs. In order to avoid this, a state of a cell voltage is monitored by a battery monitoring device to prevent a battery from falling into an abnormal state such as an overcharge state or an overdischarge state and so on.

When the assembled battery is used as the battery of large-capacity and high-output as described above, a necessary amount of battery cells are connected in series to obtain a required voltage. On this occasion, if the cell voltage of all the battery cells is monitored by one battery monitoring device, it is necessary for the battery monitoring device to be configured by a high withstand voltage element, which increases a chip area and causes an increase in cost. In addition, the required voltage varies with each equipment (circuit) that is used, so that there is a possibility that the specification of the battery monitoring device is overspecified, which also causes an increase in cost. Therefore, multiple battery cells are divided by a prescribed amount to configure battery cell groups including the prescribed amount of battery cells, and battery monitoring devices are provided on each battery cell group to monitor the cell voltage of each battery. On this occasion, it is known a battery monitoring system in which multiple battery monitoring devices corresponding to the amount of the battery cells are connected in series and a daisy-chain is formed by the multiple battery monitoring devices. By using this method, the cost of the battery monitoring devices can be suppressed.

For example, the battery monitoring system recited in Japanese Patent Application Laid-Open No. 2013-83514 (patent literature 1) is known as such a battery monitoring system. In patent literature 1, a battery monitoring system is recited, and the battery monitoring system includes: a voltage detecting circuit, which is provided on each block obtained by dividing a battery into a plurality of blocks and detects the voltages of the battery cells belonging to each block; a management circuit, which belongs to a power system having a lower voltage than a power system of the voltage detecting circuit, and manages voltage detecting data of each battery cell from the voltage detecting circuit; a communication method convertor, which belongs to the same power system as the voltage detecting circuit, and is connected to the voltage detecting circuit by a first communication line for communicating by a clock synchronous communication method and connected to with the management circuit by a second communication line for communicating by a clock asynchronous communication method; and insulation elements which are interposed in the second communication line.

On the other hand, in U.S. Pat. No. 8,908,779 (patent literature 2), a system which includes an assembled battery control unit and multiple single battery control units connected in series is recited. In the system, a signal transmitted from the assembled battery control unit is input to the single battery control unit on a first stage through insulation elements and a signal communication path, an output of the single battery control unit on the first stage is input to the single battery control unit on a next stage through the signal communication path, and an output of the single battery control unit on a final stage is transmitted to the assembled battery control unit through the insulation elements and the signal communication path. In addition, in patent literature 2, a technology which modulates and demodulates a 4-line SPI (Serial Peripheral Interface) signal to a 2-line differential pulse signal is recited.

In a battery monitoring system, for example, a case, in which a communication signal including commands is transmitted from the control device to battery monitoring devices arranged on a downstream side of a communication path, is considered, and the battery monitoring system includes: multiple battery monitoring devices which are provided on each battery cell group, connected in series, and capable of communicating with the adjacent battery monitoring devices; and a control device which is communicatively connected to the multiple battery monitoring devices and controls each of the battery monitoring devices. On this occasion, a communication signal of a SPI format output from the control device is converted to a differential format by a signal converting device and transmitted to the battery monitoring device. The communication signal of the differential format is transmitted to the battery monitoring device serving as a communication target, passing through each of the battery monitoring devices arranged on an upstream side of the communication path viewed from the battery monitoring device serving as the communication target. Each of the battery monitoring devices arranged on the upstream side of the communication path transmits the communication signal of the differential format to the battery monitoring devices on a next stage in the differential format without being demodulated to the SPI format.

By using such a transmitting method in which the communication signal of the differential format is sequentially transmitted from the battery monitoring device arranged on the upstream side of the communication path to the battery monitoring device arranged on the downstream side of the communication path, a waveform unsharpening of the communication signal becomes greater as the amount of connected battery monitoring devices increases.

If the waveform unsharpening becomes greater in the communication signal in the communication method where the communication signal of the differential format is used, there is a problem that a pulse width of the communication signal is reduced when the communication signal is received by a differential comparator serving as a receiving circuit. If the pulse width is reduced, there is a risk that it becomes difficult to properly receive data in a receiving side.

Here, there is a need that a less expensive flat cable is used as a communication line in signal transmitting. However, when the flat cable is used, the waveform unsharpening of the communication signal becomes greater and a variation of the pulse width becomes greater, compared with a case when a high-quality Ethernet (a registered trademark) cable is used. In anticipation of the decrease in the pulse width, a measure to increase the pulse width of the communication signal is also considered, but on this occasion, a transmitting speed of the communication signal is reduced.

The present disclosure aims at suppressing the variation of the pulse width of the communication signal transmitted and received between the battery monitoring devices.

SUMMARY

The battery monitoring device according to an embodiment of the present disclosure includes: a receiving unit, which receives a communication signal input from the outside; a signal regenerating unit, which regenerates a communication signal so that a width of a pulse that is included in the communication signal received by the receiving unit becomes a prescribed magnitude; a transmitting unit, which transmits the communication signal regenerated by the signal regenerating unit to the outside; and a processing unit, which carries out a process of measuring a cell voltage of battery cells according to the communication signal received by the receiving unit.

A battery monitoring device according to another embodiment of the present disclosure includes: a first receiving unit and a second receiving unit, which respectively receive a communication signal input from the outside; a first signal regenerating unit, which regenerates the communication signal so that a width of a pulse that is included in the communication signal received by the first receiving unit becomes a prescribed magnitude; a second signal regenerating unit, which regenerates the communication signal so that a width of a pulse that is included in the communication signal received by the second receiving unit becomes a prescribed magnitude; a first transmitting unit, which transmits the communication signal regenerated by the first signal regenerating unit to the outside; a second transmitting unit, which transmits the communication signal regenerated by the second signal regenerating unit to the outside; and a processing unit, which carries out a process of measuring a cell voltage of battery cells according to the communication signal received by the first receiving unit or the second receiving unit.

A battery monitoring system according to an embodiment of the present disclosure includes multiple battery monitoring devices connected in series and each of which has a function of monitoring battery cells, and is capable of communicating between the battery monitoring devices adjacent to one another. Each of the multiple battery monitoring devices includes: a receiving unit, which receives the communication signal input from the outside; a signal regenerating unit, which regenerates a communication signal so that a width of a pulse that is included in the communication signal received by the receiving unit becomes a prescribed magnitude; a transmitting unit, which transmits the communication signal regenerated by the signal regenerating unit to the outside; and a processing unit, which carries out a process of measuring a cell voltage of the battery cells according to the communication signal received by the receiving unit.

A battery monitoring system according to another embodiment of the present disclosure includes multiple battery monitoring devices connected in series and each of which has the function of monitoring battery cells, and is capable of communicating between the battery monitoring devices adjacent to one another. Each of the multiple battery monitoring devices includes: a first receiving unit and a second receiving unit, which respectively receive the communication signal input from the outside; a first signal regenerating unit, which regenerates the communication signal so that a width of a pulse that is included in the communication signal received by the first receiving unit becomes a prescribed magnitude; a second signal regenerating unit, which regenerates the communication signal so that a width of a pulse that is included in the communication signal received by the second receiving unit becomes a prescribed magnitude; a first transmitting unit, which transmits the communication signal regenerated by the first signal regenerating unit to the outside; a second transmitting unit, which transmits the communication signal regenerated by the second signal regenerating unit to the outside; and a processing unit, which carries out a process of measuring a cell voltage of the battery cells according to the communication signal received by the first receiving unit or the second receiving unit.

DESCRIPTION OF THE EMBODIMENTS

According to the present disclosure, the variation of the pulse width of the communication signal transmitted and received between the battery monitoring devices can be suppressed.

Next, embodiments of the present disclosure are described with reference to drawings. Furthermore, in each drawing, substantially same or equivalent components or sections are marked with the same referential symbols.

First Embodiment

Figure 1:
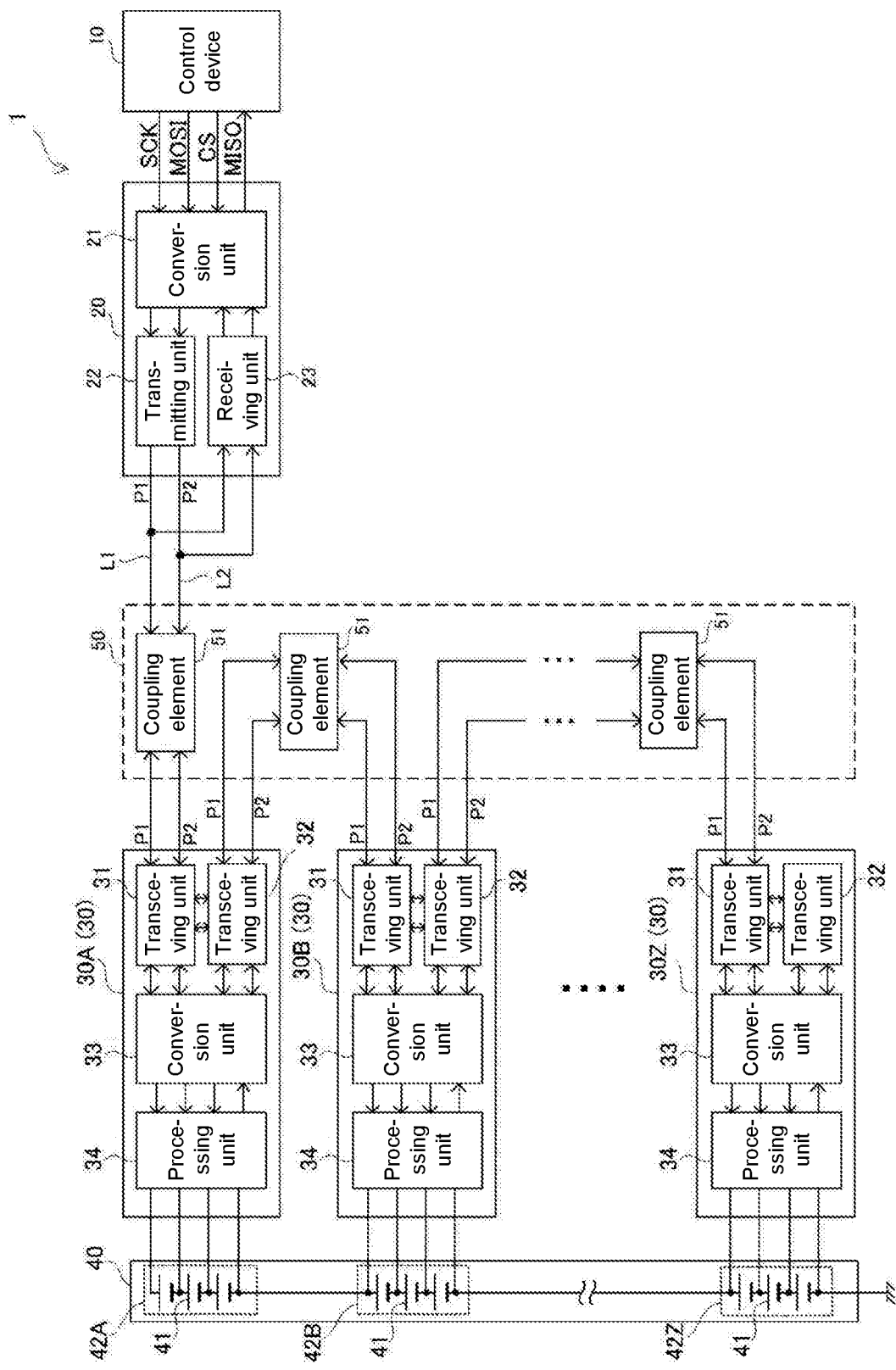
FIG. 1 is a drawing showing a structure of a battery monitoring system according to an embodiment of the present disclosure.

FIG. 1 is a drawing showing a structure of a battery monitoring system 1 according to an embodiment of the present disclosure. The battery monitoring system 1 is a system which monitors a state of each of battery cells 41 of an assembled battery 40 that includes multiple battery cells 41 connected in series. The battery monitoring system 1 is configured by the assembled battery 40, a control device 10, a signal converting device 20, multiple battery monitoring devices 30A, 30B . . . 30Z and a transmission path 50. In the following, when the battery monitoring devices 30A, 30B . . . 30Z are not distinguished from one another or are named generically, they are noted as "battery monitoring devices 30".

The control device 10 sends various commands to the battery monitoring devices 30 by using a SPI communication method. That is, the control device 10 functions as a master device in the SPI communication method, and the battery monitoring devices 30 function as a slave device in the SPI communication method. The control device 10 is configured by a computer including a CPU (Central Processing Unit), a ROM (Read Only Memory) and a RAM (Random Access Memory) and so on. The control device 10 sends various commands to the battery monitoring devices 30 by means of a clock signal SCK, a data signal MOSI, and a chip select signal CS of the SPI format. The data signal MISO which is transmitted from the battery monitoring devices 30 based on the commands is received by the control device 10.

The clock signal SCK is a signal which controls a movement timing of the battery monitoring devices 30. That is, the battery monitoring devices 30 move in synchronization with the clock signal SCK. The data signal MOSI includes the commands to the battery monitoring devices 30. In addition, in the system including multiple battery monitoring devices 30, the data signal MOSI may include designation information which designates any one of the multiple battery monitoring devices 30. The chip select signal CS is a signal which transfers the battery monitoring devices 30 to an active state or an inactive state by a level transition. For example, the battery monitoring devices 30 are transferred to the active state by the transition of the chip select signal CS to a low-level, and the battery monitoring devices 30 are transferred to the inactive state by the transition of the chip select signal CS to a high-level. In the embodiment, the battery monitoring devices 30 are maintained in the active state while the chip select signal CS presents a low-level.

The clock signal SCK, the data signal MOSI and the chip select signal CS output from the control device 10 are respectively supplied to the signal converting device 20. The data signal MISO output from the signal converting device 20 is supplied to the control device 10.

The signal converting device 20 is configured by a conversion unit 21, a transmitting unit 22 and a receiving unit 23. The conversion unit 21 integrates the clock signal SCK, the data signal MOSI and the chip select signal CS of the SPI format supplied from the control device 10, and converts them to a communication signal of a differential format consisting of a first pulse train P1 and a second pulse train P2. The transmitting unit 22 sends the first pulse train P1 to a signal line L1, and sends the second pulse train P2 to a signal line L2. In this way, the clock signal SCK, the data signal MOSI and the chip select signal CS of the SPI format output from the control device 10 are converted, by the signal converting device 20, to the communication signal of the differential format consisting of the first pulse train P1 and the second pulse train P2 and sent to the transmission path 50.

The transmission path 50 is a line for carrying out a communication between the signal converting device 20 and the battery monitoring devices 30. The transmission path 50 includes coupling elements 51 which insulate the signal converting device 20 and the battery monitoring devices 30, and a DC component of the signal which passes through the transmission path 50 is removed by the coupling elements 51. For example, photo couplers, isolators, transformers or capacitors and the like can be used as the coupling elements 51. The first pulse train P1 sent to the signal line L1 and the second pulse train P2 sent to the signal line L2 are respectively supplied to the battery monitoring devices 30 through the transmission path 50.

The multiple battery cells 41 which configure the assembled battery 40 are divided into groups so that each of the group includes multiple battery cells, and battery cell groups 42A, 42B . . . 42Z are formed accordingly. The battery monitoring device 30A is provided corresponding to the battery cell group 42A of a highest potential, and monitors a state of each of the battery cells 41 included in the battery cell group 42A. The battery monitoring device 30B is provided corresponding to the battery cell group 42B, and monitors a state of each of the battery cells 41 included in the battery cell group 42B. The battery monitor device 30Z is provided corresponding to the battery cell group 42Z of a lowest potential, and monitors a state of each of the battery cells 41 included in the battery cell group 42Z. Furthermore, the amount of the battery cells 41 which are monitoring targets of each battery monitoring device 30 can be appropriately increased or reduced.

Each of the battery monitoring devices 30 has transceiving units 31, 32, a conversion unit 33 and a processing unit 34. The transceiving units 31 and 32 transmit and receive the communication signal through the transmission path 50 with an adjacent battery monitoring device 30 or the signal converting device 20.

In each of the battery monitoring devices 30, with the exception of the battery monitoring device 30Z arranged on the lowest potential side, the transceiving unit 32 is connected to the transceiving unit 31 of the adjacent battery monitoring device 30 on the low potential side, and with the exception of the battery monitoring device 30A arranged on the highest potential side, the transceiving unit 31 is connected to the transceiving unit 32 of the battery monitoring device 30 on the high potential side. That is, the multiple battery monitoring devices 30 are connected in series so as to form a daisy chain, and can communicate with the other adjacent battery monitoring device 30. In the battery monitoring system 1 according to the embodiment, the battery monitoring devices 30 adjacent to one another can communicate interactively. That is, each battery monitoring device 30 can transmit/receive the communication signal to/from the adjacent battery monitoring device 30 on the high potential side and to/from the adjacent battery monitoring device 30 on the low potential side.

The transceiving unit 31 of the battery monitoring device 30A arranged on the highest potential side is connected to the transmitting unit 22 and the receiving unit 23 of the signal converting device 20 through the transmission path 50. That is, the communication signal from the control device 10 to the battery monitoring device 30 and the communication signal from the battery monitoring device 30 to the control device 10 pass through the battery monitoring device 30A.

The conversion unit 33 converts the communication signal of the differential format received by the transceiving units 31 and 32 into the clock signal SCK, the data signal MOSI and the chip select signal CS of the SPI format. The conversion unit 33 supplies the clock signal SCK, the data signal MOSI and the chip select signal CS restored by a conversion process to the processing unit 34.

The processing unit 34 carries out a prescribed process based on the clock signal SCK, the data signal MOSI and the chip select signal CS supplied from the conversion unit 33. That is, the processing unit 34 becomes an active state by the transition of the chip select signal CS to the low-level, and carries out a process corresponding to the command included in the data signal MOSI in synchronization with the clock signal SCK. A specific structure of the processing unit 34 is described in the following.

Figure 2:
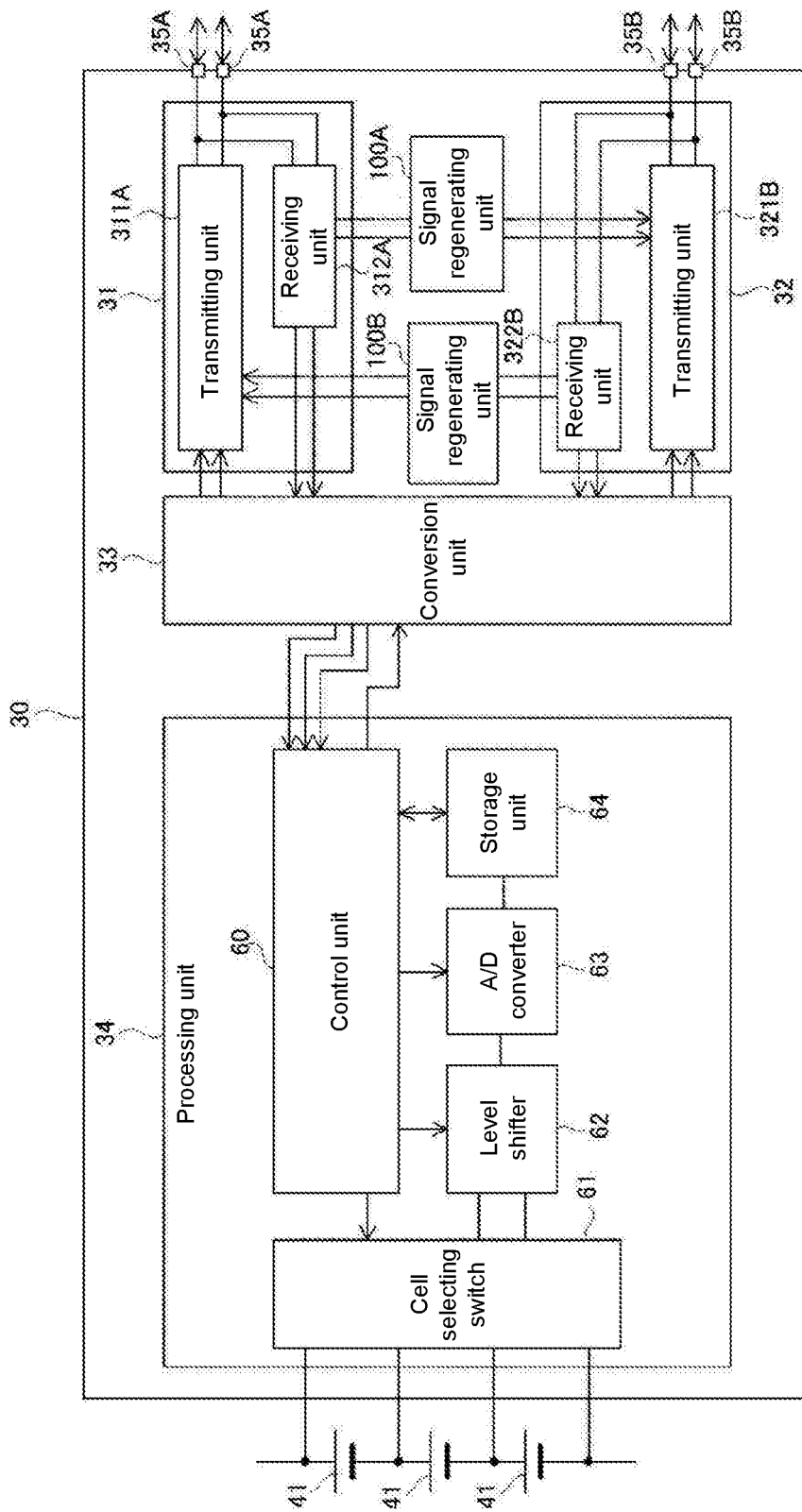
FIG. 2 is a drawing showing a structure of a battery monitoring device according to an embodiment of the present disclosure.

FIG. 2 is a drawing showing a specific structure of a battery monitoring device 30. The processing unit 34 includes a control unit 60, a cell selecting switch 61, a level shifter 62, an A/D convertor 63 and a storage unit 64. The cell selecting switch 61 selects, according to a control signal supplied from the control unit 60, one of the battery cells 41 serving as the monitoring targets, and outputs the potential of the positive electrode and the potential of the negative electrode of the selected battery cell. The level shifter 62 outputs a cell voltage which is a difference of the potential of the positive electrode and the potential of the negative electrode of the battery cell 41 selected by the cell selecting switch 61 with a level based on a ground potential. The A/D convertor 63 outputs a digital value corresponding to the cell voltage output from the level shifter 62. The storage unit 64 is a storage medium which stores the digital value of the cell voltage output from the A/D convertor 63.

The control unit 60 controls the cell selecting switch 61, the level shifter 62, the A/D convertor 63 and the storage unit 64 according to the commands included in the data signal MOSI obtained by the conversion process of the conversion unit 33.

The transceiving unit 31 has a transmitting unit 311A and a receiving unit 312A connected to a communication port 35A. The transceiving unit 32 has a transmitting unit 321B and a receiving unit 322B connected to a communication port 35B. The battery monitoring device 30 includes signal regenerating units 100A and 100B provided between the transceiving unit 31 and the transceiving unit 32.

The receiving unit 312A receives the communication signal of the differential format input to the communication port 35A, and supplies the receive communication signal to the conversion unit 33 and the signal regenerating unit 100A.

The transmitting unit 311A sends the communication signal of the differential format supplied from the conversion unit 33 and a regenerated communication signal of the differential format supplied from the signal regenerating unit 100B to the transmission path 50 through the communication port 35A.

The receiving unit 322B receives the communication signal of the differential format input to the communication port 35B, and supplies the received communication signal to the conversion unit 33 and the signal regenerating unit 100B.

The transmitting unit 321B sends the communication signal of the differential format supplied from the conversion unit 33 and a regenerated communication signal of the differential format supplied from the signal regenerating unit 100A to the transmission path 50 through the communication port 35B.

The signal regenerating unit 100A regenerates the communication signal so that the width of the pulse included in the communication signal supplied from the receiving unit 312A becomes a prescribed magnitude, and supplies the regenerated communication signal to the transmitting unit 321B.

The signal regenerating unit 100B regenerates the communication signal so that the width of the pulse included in the communication signal supplied from the receiving unit 322B becomes a prescribed magnitude, and supplies the regenerated communication signal to the transmitting unit 311A.

Figure 3:
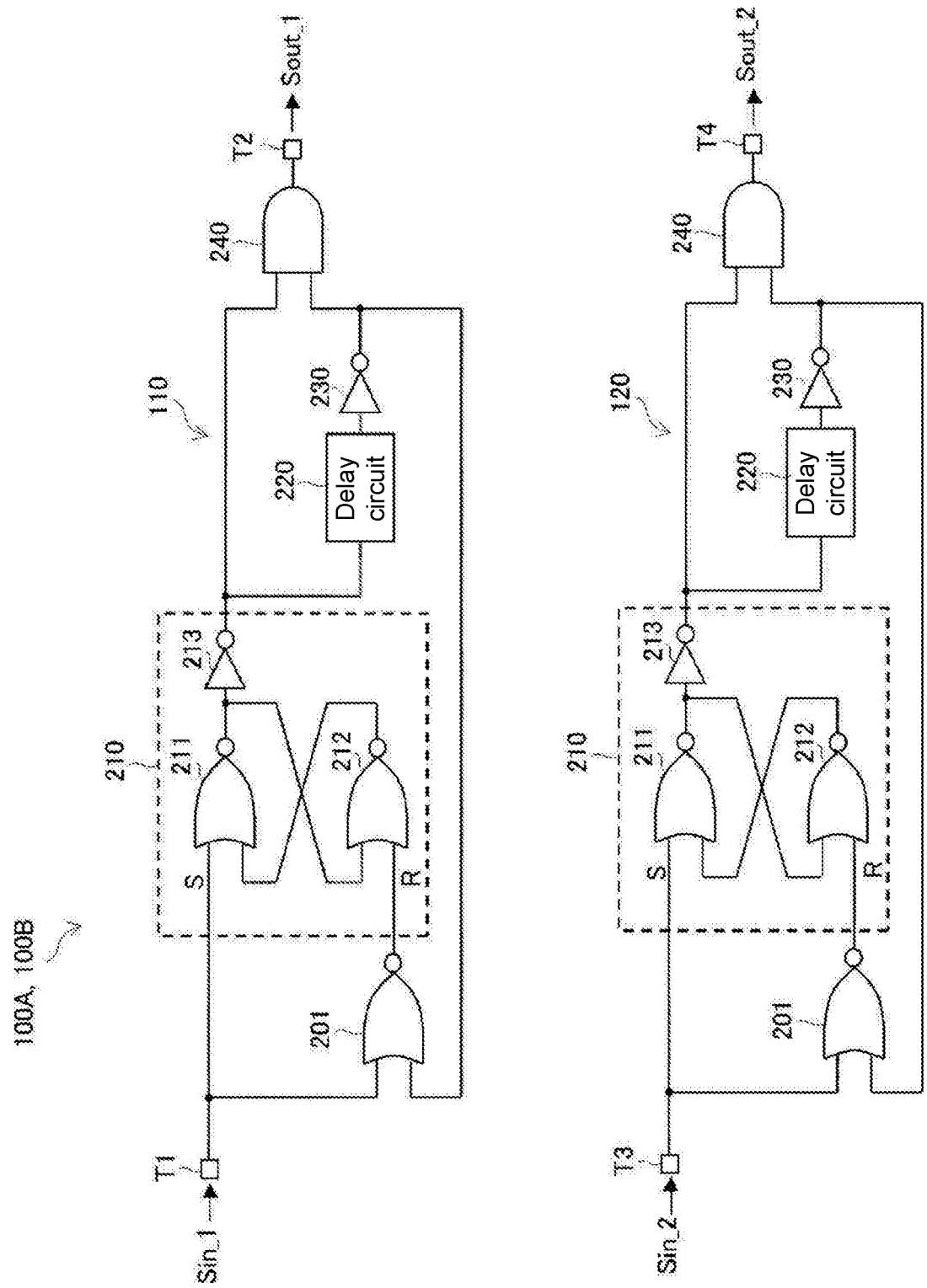
FIG. 3 is a drawing showing one example of structures of a signal regenerating unit according to an embodiment of the present disclosure.

FIG. 3 is a drawing showing one example of structures of the signal regenerating units 100A and 100B. The signal regenerating units 100A and 100B have the same structure.

The signal regenerating units 100A and 100B are configured by a first circuit 110 and a second circuit 120 which are respectively corresponding to the first pulse train P1 and the second pulse train P2 that configure the communication signal of the differential format. That is, the first circuit 110 regenerates the first pulse train P1 of the communication signal so that the width of the pulse included in the first pulse train P1 of the communication signal becomes a prescribed magnitude, and the second circuit 120 regenerates the second pulse train P2 of the communication signal so that the width of the pulse included in the second pulse train P2 of the communication signal becomes a prescribed magnitude. The first circuit 110 and the second circuit 120 have the same structure.

Next, the structure of the first circuit 110 is described. The first circuit 110 is configured by a NOR circuit 201, an RS latch circuit 210, a delay circuit 220, a NOT circuit 230 and an AND circuit 240. The RS latch circuit 210 is configured by NOR circuits 211, 212 and a NOT circuit 213. One of input ends of the NOR circuit 211 functions as a set input terminal, and one of input ends of the NOR circuit 212 functions as a reset input terminal.

In the NOR circuit 201, one of the input ends is connected to an input terminal T1 to which the first pulse train P1 of the communication signal is input as an input signal Sin_1, the other input end is connected to an output end of the NOT circuit 230, and the output end is connected to one of input ends of the NOR circuit 212 of the RS latch circuit 210.

In the NOR circuit 211, one of the input ends which functions as the set input terminal S of the RS latch circuit 210 is connected to the input terminal T1 to which the first pulse train P1 of the communication signal is input, the other input end is connected to an output end of the NOR circuit 212, and the output end is connected to the input end of the NOT circuit 213. In the NOR circuit 212, one of the input ends which functions as the reset input terminal R of the RS latch circuit 210 is connected to the output end of the NOR circuit 201, and the other input end is connected to the output end of the NOR circuit 211. The output end of the NOT circuit 213 serves as an output end of the RS latch circuit 210, and is connected to one of the input ends of the AND circuit 240 and the input end of the delay circuit 220.

The delay circuit 220 outputs, from the output end, a delay signal which is obtained by delaying a signal output from an output end of the NOT circuit 213 (that is, an output signal of the RS latch circuit 210). In the NOT circuit 230, the input end is connected to the output end of the delay circuit 220, and the output end is connected to the other input end of the AND circuit 240 and the other input end of the NOR circuit 201. In the AND circuit 240, one of the input ends is connected to the output end of the NOT circuit 213 which is the output end of the RS latch circuit 210, and the other input end is connected to the output end of the NOT circuit 230. The AND circuit 240 outputs a logical product of the output signal of the RS latch circuit 210 and a signal obtained by the logic inversion of an output signal of the delay circuit 220 as an output signal Sout_1 of the first circuit 110 from the output terminal T2. The output signal Sout_1 is a signal composed of the pulse train obtained by regenerating the first pulse train P1.

The second circuit 120 is different from the first circuit 110 in that, one of the input ends of the NOR circuit 201 and one of the input ends of the NOR circuit 211 which functions as the set input terminal S of the RS latch circuit 210 are connected to an input terminal T3, and the output end of the AND circuit 240 is connected to an output terminal T4. The second pulse train P2 of the communication signal is input to the input terminal T3 as an input signal Sin_2, and the logical product of the output signal of the RS latch circuit 210 and the signal obtained by the logic inversion of the output signal of the delay circuit 220 is output as an output signal Sout_2 of the second circuit 120 from the output terminal T4. The output signal Sout_2 is a signal composed of the pulse train obtained by regenerating the second pulse train P2.

Figure 4:
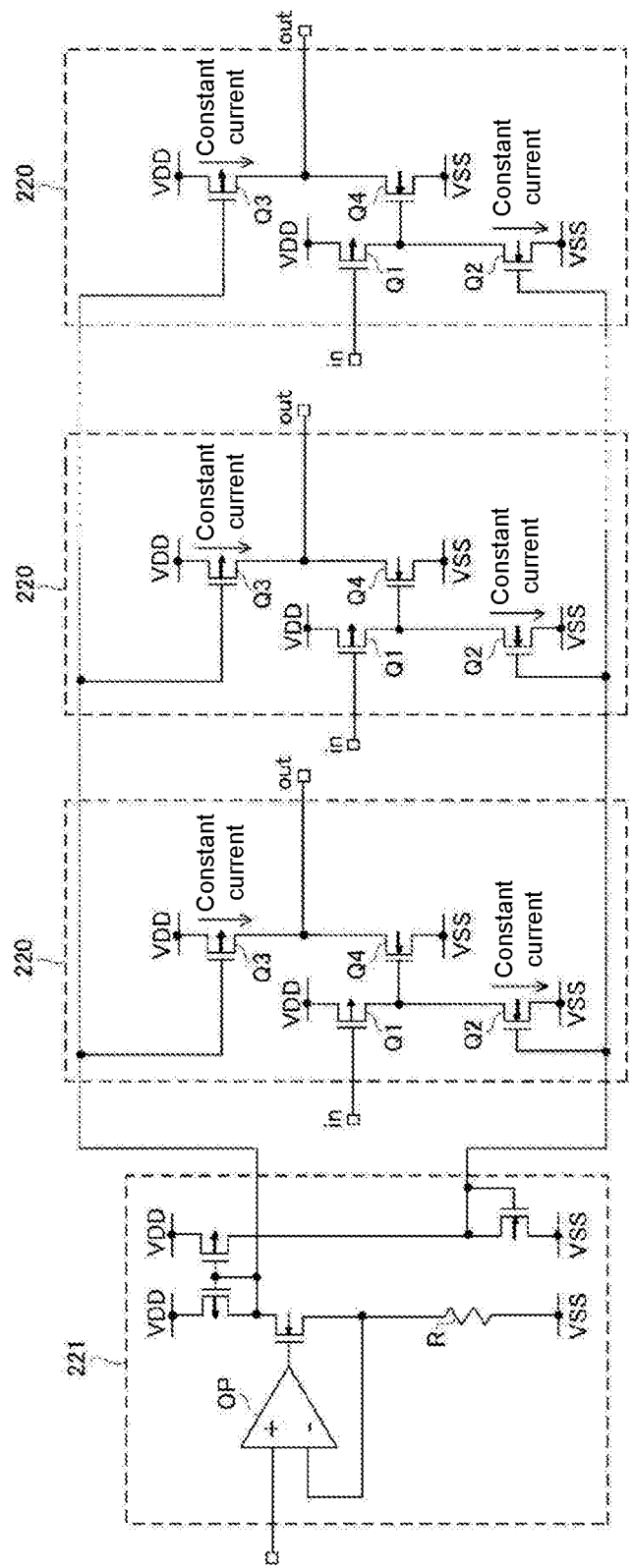
FIG. 4 is a drawing showing one example of structures of a delay circuit according to an embodiment of the present disclosure.

FIG. 4 is a drawing showing one example of a structure of the delay circuit 220. A circuit block which includes multiple delay circuits 220 is shown in FIG. 4. The delay circuits 220 are not only used in the signal regenerating units 100A, 100B, but also in other sections such as the processing unit or the conversion unit and so on. A necessary amount of delay circuits 220 are provided in the circuit block. The multiple delay circuits 220 are respectively connected to a voltage current conversion circuit 221. The voltage current conversion circuit 221 generates a constant current of a magnitude corresponding to a magnitude of a constant voltage input to a non-inverting input terminal of an operational amplifier OP and a resistance value of a resistance element R. Each of the delay circuits 220 includes transistors Q1, Q2, Q3, and Q4 in which the constant current generated by the voltage current conversion circuit 221 flows. The transistors Q2 and Q3 of which gates are connected to the voltage current conversion circuit 221 function as resistance elements which have a resistance value corresponding to the magnitude of the current flows therein. A signal is output from a drain of the transistor Q4, and the signal is obtained by delaying an input signal input to the gate of the transistor Q1 by a length corresponding to the resistance value of the transistors Q2 and Q3. A delay time of the delay circuit 220 can be adjusted according to the magnitude of the constant voltage input to the non-inverting input terminal of the operational amplifier OP and the resistance value of the resistance element R. The pulse width of the communication signal after being regenerated by the signal regenerating units 100A and 100B can be adjusted according to the delay time of the delay circuit 220.

Figure 5:
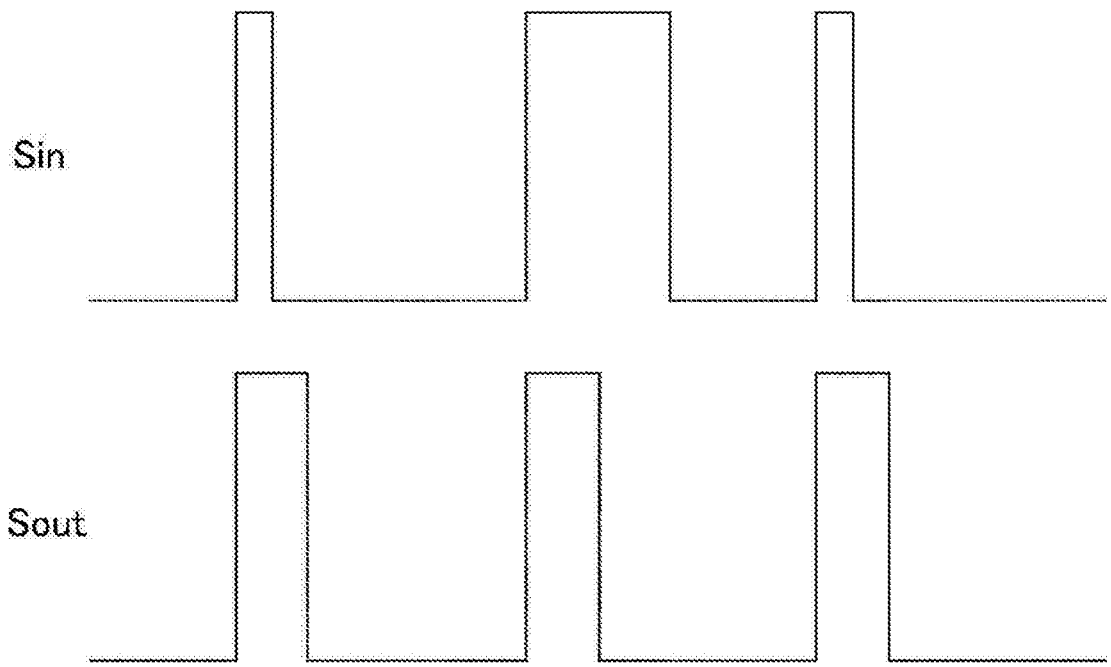
FIG. 5 is a drawing showing one example of waveforms of input-output signals of a first circuit and a second circuit in a signal regenerating unit according to an embodiment of the present disclosure.

FIG. 5 is a drawing showing one example of waveforms of the input signal Sin and the output signal Sout of the first circuit 110 and the second circuit 120 of the signal regenerating units 100A and 100B. Furthermore, circuit structures of the first circuit 110 and the second circuit 120 of the signal regenerating units 100A and 100B are the same with one another; therefore, input-output characteristics of the first circuit 110 and the second circuit 120 are the same with one another. As shown in FIG. 5, the signal regenerating units 100A and 100B carry out a process of regenerating a signal so that the width of the pulse included in the input signal Sin becomes a prescribed magnitude, and output the regenerated signal as the output signal Sout. In the embodiment, the signal regenerating units 100A and 100B increase a pulse width which is smaller than a prescribed magnitude, and decrease a pulse width which is greater than a prescribed magnitude.

Next, one example of an operation of the battery monitoring system 1 is described. In the following description, an operation when data of the cell voltage is read out for the battery monitoring device 30Z is described as one example.

The control device 10 includes, in the data signal MOSI of the SPI signal, a command which instructs to read out the data of the cell voltage and a designation information which designates a target to which the command is executed, and supplies the data signal MOSI to the signal converting device 20 along with the clock signal SCK and the chip select signal CS. The conversion unit 21 of the signal converting device 20 converts the clock signal SCK, the data signal MOSI and the chip select signal CS received from the control device 10 to the communication signal of the differential format including the first pulse train P1 and the second pulse train P2, and sends the communication signal to the transmission path 50.

The communication signal of the differential format including the command is input to the communication port 35A of the battery monitoring device 30A, and is received by the receiving unit 312A of the transceiving unit 31 of the battery monitoring device 30A. The receiving unit 312A supplies the received communication signal including the command to the conversion unit 33 and the signal regenerating unit 100A.

The conversion unit 33 converts the communication signal of the differential format which is supplied from the receiving unit 312A and includes the command into a clock signal SCK, a data signal MOSI and a chip select signal CS of the SPI format, and supplies each signal obtained by the conversion process to the processing unit 34. The processing unit 34 executes a process corresponding to the command included in the data signal MOSI when the designation information included in the data signal MOSI designates the processing unit 34, but does not execute the process corresponding to the command included in the data signal MOSI when the designation information included in the data signal MOSI does not designate the processing unit 34. Here, because the executing target of the command shown by the designation information is not the battery monitoring device 30A, the processing unit 34 of the battery monitoring device 30A does not execute the process corresponding to the command.

The signal regenerating unit 100A regenerates the communication signal so that the width of the pulse included in the communication signal supplied from the receiving unit 312A becomes a prescribed magnitude. The signal regenerating unit 100A supplies the regenerated communication signal to the transmitting unit 321B of the transceiving unit 32. The transmitting unit 321B sends the regenerated communication signal supplied from the signal regenerating unit 100A to the transmission path 50 through the communication port 35B.

The communication signal including the command sent to the transmission path 50 is input to the communication port 35A of the battery monitoring device 30B on a next stage, and is received by the receiving unit 312A of the transceiving unit 31 of the battery monitoring device 30B. The receiving unit 312A supplies the received communication signal including the command to the conversion unit 33 and the signal regenerating unit 100A.

The conversion unit 33 converts the communication signal of the differential format which is supplied from the receiving unit 312A and includes the command into a clock signal SCK, a data signal MOSI and a chip select signal CS of the SPI format, and supplies each signal obtained by the conversion process to the processing unit 34. Because the executing target of the command shown by the designation information included in the data signal MOSI is not the battery monitoring device 30B, the processing unit 34 does not execute the process corresponding to the command.

The signal regenerating unit 100A regenerates the communication signal so that the width of the pulse included in the communication signal supplied from the receiving unit 312A becomes a prescribed magnitude. The signal regenerating unit 100A supplies the regenerated communication signal to the transmitting unit 321B of the transceiving unit 32.

The transmitting unit 321B sends the regenerated communication signal supplied from the signal regenerating unit 100A to the transmission path 50 through the communication port 35B. The communication signal including the command sent to the transmission path 50 is input to the communication port 35A of the battery monitoring device (not shown) adjacent to a low potential side of the battery monitoring device 30B.

In this way, the communication signal, which includes the command issued from the control device 10 and is transmitted from the control device 10 to each battery monitor device 30, is sequentially transmitted from the battery monitoring device 30 on the high potential side to the battery monitor device 30 on the low potential side. The communication signal is regenerated by the signal regenerating unit 100A and the pulse width is repaired, when the communication signal passes through the multiple battery monitoring devices 30.

The communication signal of the differential format including the command is input to the communication port 35A of the battery monitoring device 30Z on the final stage, and is received by the receiving unit 312A of the transceiving unit 31 of the battery monitoring device 30Z. The receiving unit 312A supplies the received communication signal to the conversion unit 33.

The conversion unit 33 converts the communication signal of the differential format which is supplied from the receiving unit 312A and includes the command into a clock signal SCK, a data signal MOSI and a chip select signal CS of the SPI format, and supplies each signal obtained from the conversion process to the processing unit 34. If it is identified that the designation information included in the data signal MOSI designates the processing unit 34, the processing unit 34 reads out, according to the command included in the data signal MOSI, data (referred to as cell voltage data in the following part) which shows a measurement value of the cell voltage stored in a storage unit 64 inside the processing unit 34, and supplies the read out cell voltage data to the conversion unit 33. The conversion unit 33 converts the cell voltage data read out by the processing unit 34 into a communication signal of the differential format, and supplies the communication signal to the transmitting unit 311A of the transceiving unit 31. The transmitting unit 311A sends the communication signal including the cell voltage data to the transmission path 50 through the communication port 35A.

The communication signal including the cell voltage data transmitted from the transmitting unit 311A is input to the communication port 35B of the battery monitoring device (not shown) adjacent on the high potential side of the battery monitoring device 30Z, and is received by the receiving unit 322B of the transceiving unit 32 of the battery monitoring device. The receiving unit 322B supplies the received communication signal to the signal regenerating unit 100B.

The signal regenerating unit 100B regenerates the communication signal so that the width of the pulse included in the communication signal supplied from the receiving unit 322B becomes a prescribed magnitude. The signal regenerating unit 100B supplies the regenerated communication signal to the transmitting unit 311A of the transceiving unit 31. The transmitting unit 311A sends the regenerated communication signal including the cell voltage data and supplied from the signal regenerating unit 100B to the transmission path 50 through the communication port 35A.

In this way, the communication signal which includes the cell voltage data and so on and is transmitted from the battery monitoring devices 30 to the control device 10 is sequentially transmitted from the battery monitoring device 30 on the low potential side to the battery monitoring device 30 on the high potential side. The communication signal is regenerated by the signal regenerating unit 100B and the pulse width is corrected when the communication signal passes through the multiple battery monitoring devices 30.

The transmitting unit 311A of the transceiving unit 31 of the battery monitoring device 30A sends the communication signal including the cell voltage data to the transmission path 50 through the communication port 35A. The communication signal including the cell voltage data and sent to the transmission path 50 is received by the receiving unit 23 of the signal converting device 20 and supplied to the conversion unit 21. The conversion unit 21 converts the format of the received communication signal of the differential format to the SPI format. The conversion unit 21 supplies the MISO signal including the cell voltage data and generated by the conversion process to the control device 10.

As described above, according to the battery monitoring system 1 of the embodiment of the present disclosure, the communication signal transmitted from the control device 10 to the battery monitoring devices 30 is sequentially transmitted from the battery monitoring device 30 arranged on the high potential side to the battery monitoring device 30 arranged on the low potential side. On this occasion, the communication signal is transmitted to each battery monitoring device 30 in a route different from a route passing through the conversion unit 33 and the processing unit 34 in each battery monitoring device 30, so that the communication signal is transmitted to the battery monitoring device 30 on a subsequent stage without waiting for the completion of the processing in the conversion unit 33 and the processing unit 34. Therefore, the communication signal can be transmitted to each battery monitoring device 30 at a high speed.

In this way, when the daisy-chain is configured by multiple battery monitoring devices 30, and the communication signal is transmitted by a relay method in the multiple battery monitoring devices 30, a waveform unsharpening in the communication signal increases as the transmission distance increases (that is, as a connection amount of the battery monitoring devices increases). In a communication method in which the communication signal of the differential format is used, if the waveform unsharpening in the communication signal increases, when the communication signal is received by a differential comparator serving as a receiving circuit, there is a risk that the pulse width of the communication signal decreases, and it becomes difficult to properly receive data on the receiving side. Therefore, in a battery monitoring system without a means of correcting the pulse width, the amount of the battery monitoring devices which can be included in the battery monitoring system is limited.

According to the battery monitoring system 1 of the embodiment, the communication signal, which is transmitted from the high potential side to the low potential side of the daisy-chain which is configured by multiple monitoring devices 30, is regenerated by the signal regenerating unit 100A of each battery monitoring device 30 so that the pulse width becomes a prescribed magnitude. In addition, the communication signal, which is transmitted from the low potential side to the high potential side of the daisy-chain, is regenerated by the signal regenerating unit 100B of each battery monitoring device 30 so that the pulse width becomes a prescribed magnitude. Therefore, according to the battery monitoring system 1 of the embodiment, a variation of the pulse width of the communication signal transmitted and received between the battery monitoring devices 30 can be suppressed. In this way, regardless of the transmission distance of the communication signal (that is, regardless of the connection amount of the battery monitoring devices), the pulse width of the communication signal can be kept constant, and a limitation of the amount of battery monitoring devices which can be included in the battery monitoring system can be eliminated.

Figure 6:
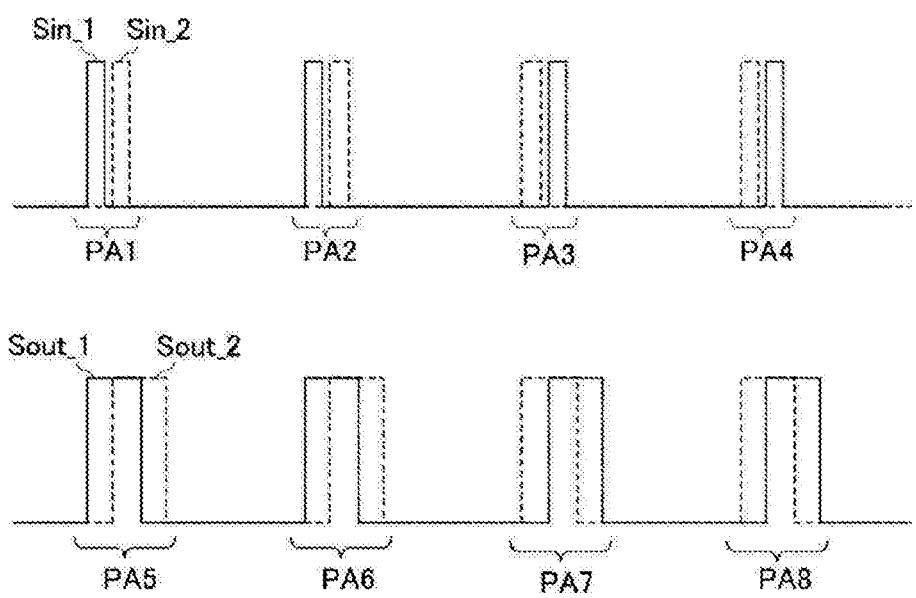
FIG. 6 is a drawing showing one example of waveforms of input-output signals of a first circuit and a second circuit in a signal regenerating unit according to an embodiment of the present disclosure.

Here, FIG. 6 is a drawing showing one example of waveforms of input-output signals of the first circuit 110 and the second circuit 120 which configure the signal regenerating unit 100A (or the signal regenerating unit 100B). The upper part of FIG. 6 is the input signals Sin_1 and Sin_2 which are respectively input to the first circuit 110 and second circuit 120, and the lower part of FIG. 6 is the output signals Sout_1 and Sout_2 which are respectively output from the first circuit 110 and the second circuit 120. For example, among pairs PA1, PA2, PA3 and PA4 consisting of temporally close input signals Sin_1 and Sin_2, the pairs PA1 and PA2 in which the input signal Sin_1 temporally precedes the input signal Sin_2 respectively represent data "1", and the pairs PA3 and PA4 in which the input signal Sin_2 temporally precedes the input signal Sin_1 respectively represent data "0". Similarly, among pairs PA5, PA6, PA7 and PA8 consisting of temporally close output signals Sout_1 and Sout_2, the pairs PA5 and PA6 in which the output signal Sout_1 temporally precedes the output signal Sout_2 respectively represent data"1", and the pairs PA7 and PA8 in which the output signal Sout_2 temporally precedes the output signal Sout_1 respectively represent data "0". When the pulse width of the communication signal is extended by the signal regenerating units 100A and 100B, as shown in the lower part of FIG. 6, there is a case in which the pulse of the output signal Sout_1 of the first circuit 110 and the pulse of the output signal Sout_2 of the second circuit 120 partially overlap.

A pair of differential signals is configured by the output signal Sout_1 of the first circuit 110 and the output signal Sout_2 of the second circuit 120. The differential signals are supposed to be received by a comparator. In the comparator, an overlapping section of the pulses in the differential signals is identified to be a section to which the 0 input and the 1 input are not input. That is, it is regarded that in the output signals Sout_1 and Sout_2, the pulse width is reduced by the width of the overlap section of the pulse. Therefore, when the overlap of the pulses occurs in the output signal Sout_2, the correction effect to the pulse width by the signal regenerating unit 100A and the signal regenerating unit 100B is deteriorated.

The signal regenerating units 100A and 100B according to a second embodiment of the present disclosure described below prevent the pulses from overlapping in the regenerated communication signal.

Second Embodiment

Figure 7:
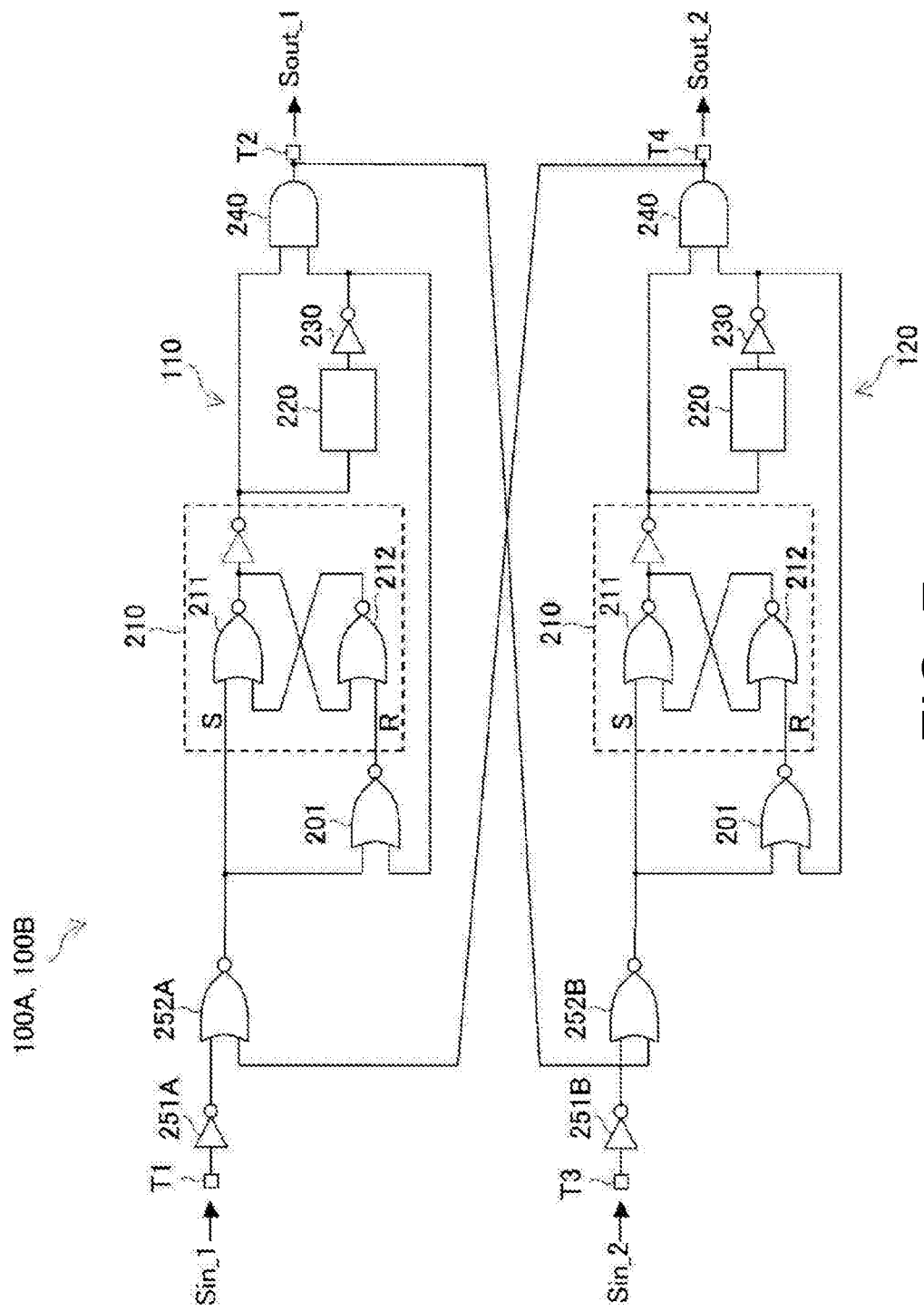
FIG. 7 is a drawing showing one example of structures of a signal regenerating unit according to another embodiment of the present disclosure.

FIG. 7 is a drawing showing one example of structures of signal regenerating units 100A and 100B according to a second embodiment of the present disclosure. The signal regenerating units 100A and 100B according to the second embodiment are different from the signal regenerating units 100A and 100B of the first embodiment shown in FIG. 3 in that, the signal regenerating units 100A and 100B of the second embodiment further include a NOT circuit 251A and a NOR circuit 252A associated with the first circuit 110, and a NOT circuit 251B and a NOR circuit 252B associated with the second circuit 120.

In the NOT circuit 251A associated with the first circuit 110, an input end is connected to the input terminal T1 in which the first pulse train P1 of the communication signal is input as the input signal Sin_1, and an output end is connected to one of the input ends of the NOR circuit 252A. The other input end of the NOR circuit 252A is connected to the output end of the AND circuit 240 which configures the second circuit 120, that is, to the output terminal T4 of the second circuit 120.

Similarly, in the NOT circuit 251B associated with the second circuit 120, an input end is connected to the input terminal T3 in which the second pulse train P2 of the communication signal is input as the input signal Sin_2, and an output end is connected to one of the input ends of the NOR circuit 252B. The other input end of the NOR circuit 252B is connected to the output end of the AND circuit 240 which configures the first circuit 110, that is, to the output terminal T2 of the first circuit 110.

The NOR circuit 252A associated with the first circuit 110 keeps a level of the signal input to the first circuit 110 at a low-level when the output signal Sout_2 of the second circuit 120 (the pulse regenerated by the second circuit 120) presents a high-level, and supplies the input signal Sin_1 input to the input terminal T1 to the first circuit 110 when the output signal Sout_2 of the second circuit 120 presents a low-level. That is, the NOR circuit 252A functions as an enable circuit which enables a function of the first circuit 110 according to the signal level of the output signal Sout_2 of the second circuit 120.

Similarly, the NOR circuit 252B associated with the second circuit 120 keeps a level of the signal input to the second circuit 120 at a low-level when the output signal Sout_1 of the first circuit 110 (the pulse regenerated by the first circuit 110) presents a high-level, and supplies the input signal Sin_2 input to the input terminal T3 to the second circuit 120 when the output signal Sout_1 of the first circuit 110 presents a low-level. That is, the NOR circuit 252B functions as an enable circuit which enables a function of the second circuit 120 according to the signal level of the output signal Sout_1 of the first circuit 110.

Figure 8:
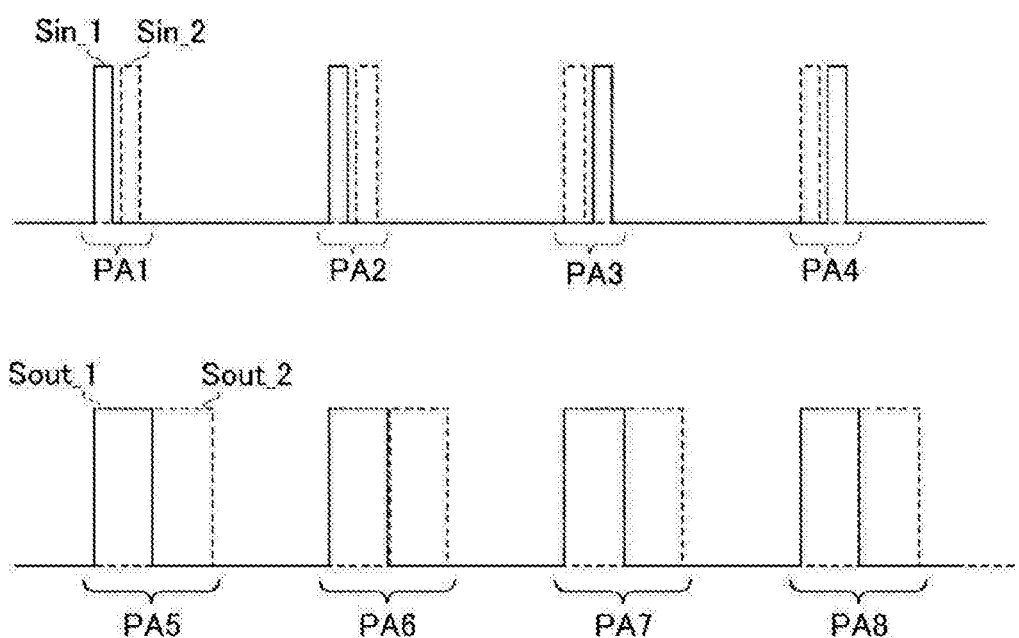
FIG. 8 is a drawing showing one example of waveforms of input-output signals of a first circuit and a second circuit in a signal regenerating unit according to an embodiment of the present disclosure.

FIG. 8 is a drawing showing one example of waveforms of input-output signals of the first circuit 110 and the second circuit 120 which configure the signal regenerating unit 100A (or the signal regenerating unit 100B) according to the second embodiment of the present disclosure. An upper part of FIG. 8 is the input signals Sin_1 and Sin_2 which are respectively input to the first circuit 110 and the second circuit 120, and a lower part of FIG. 8 is the output signals Sout_1 and Sout_2 which are respectively output from the first circuit 110 and the second circuit 120. For example, among pairs PA1, PA2, PA3 and PA4 consisting of temporally close input signals Sin_1 and Sin_2, the pairs PA1 and PA2 in which the input signal Sin_1 temporally precedes the input signal Sin_2 respectively represent data "1", and the pairs PA3 and PA4 in which the input signal Sin_2 temporally precedes the input signal Sin_1 respectively represent data "0". Similarly, among pairs PA5, PA6, PA7 and PA8 consisting of temporally close output signals Sout_1 and Sout_2, the pairs PA5 and PA6 in which the output signal Sout_1 temporally precedes the output signal Sout_2 respectively represent data"1", and the pairs PA7 and PA8 in which the output signal Sout_2 temporally precedes the output signal Sout_1 respectively represent data "0".

According to the signal regenerating unit 100A and the signal regenerating unit 100B of the second embodiment of the present disclosure, the first circuit 110 enables the function and outputs the regenerated pulse when a voltage level of the pulse regenerated by the second circuit 120 presents a low-level. Similarly, the second circuit 120 enables the function and outputs the regenerated pulse when a voltage level of the pulse regenerated by the first circuit 110 presents a low-level. Therefore, as shown in the lower part of FIG. 8, overlapping between the pulse of the output signal Sout_1 of the first circuit 110 and the pulse of the output signal Sout_2 of the second circuit 120 can be avoided, and a decline in the correction effect to the pulse width by the signal regenerating unit 100A and the signal regenerating unit 100B can be avoided.

According to the battery monitoring system to which the signal regenerating unit 100A and the signal regenerating unit 100B of the embodiment are applied, when the communication signal of the differential format is transmitted and received between the battery monitoring devices, the occurrence of the overlap of the pulses can be suppressed, so that a more stable signal transmission can be carried out.

Third Embodiment

Figure 9:
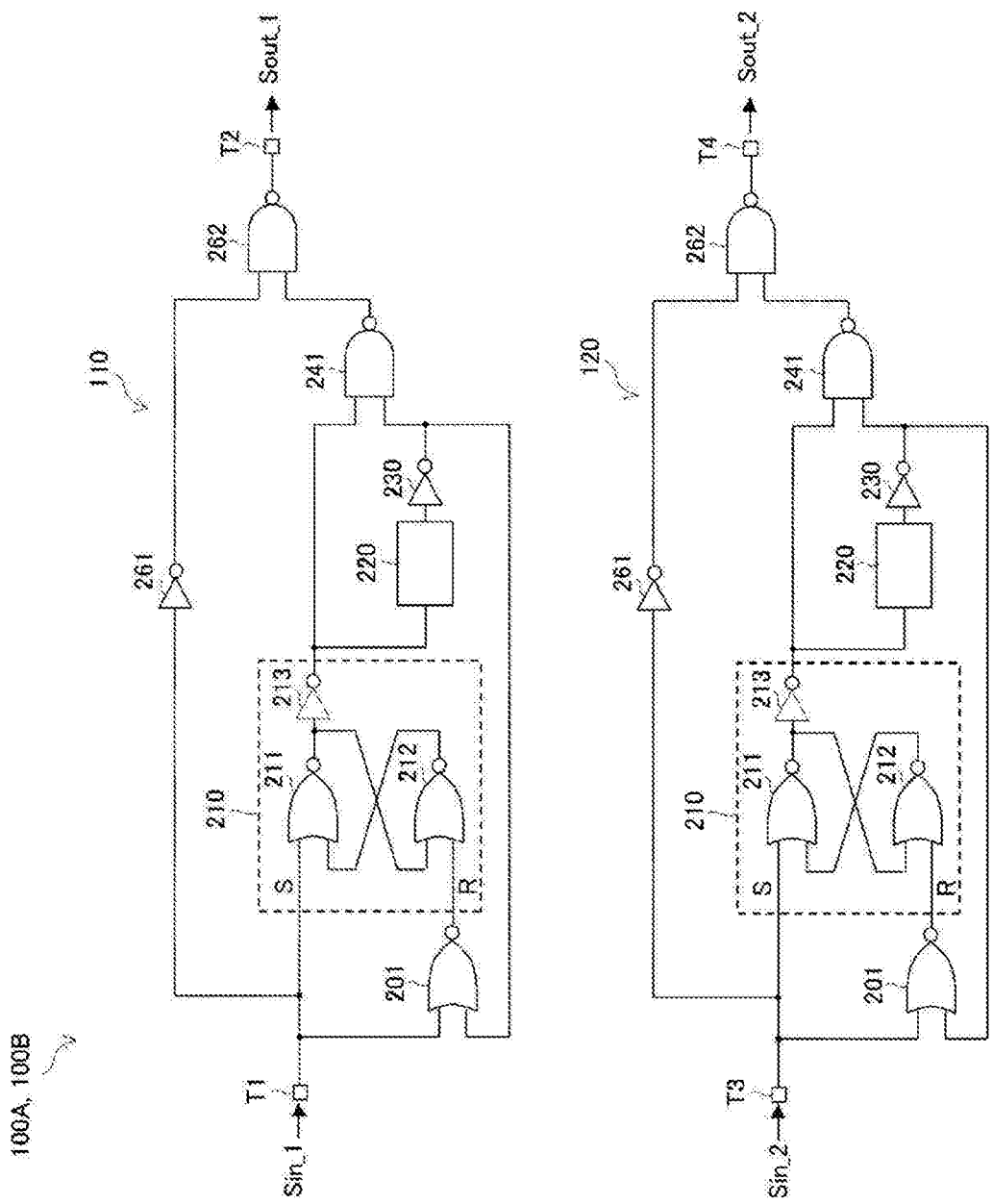
FIG. 9 is a drawing showing one example of structures of a signal regenerating unit according to another embodiment of the present disclosure.

FIG. 9 is a drawing showing one example of structures of the signal regenerating units 100A and 100B according to a third embodiment of the present disclosure. The signal regenerating units 100A and 100B according to the third embodiment are different from the signal regenerating units 100A and 100B according to the first embodiment in that, a NOT circuit 261 and a NAND circuit 262 are added in the first circuit 110 and the second circuit 120, and the AND circuit 240 shown in FIG. 3 is replaced with a NAND circuit 241.

Figure 10:
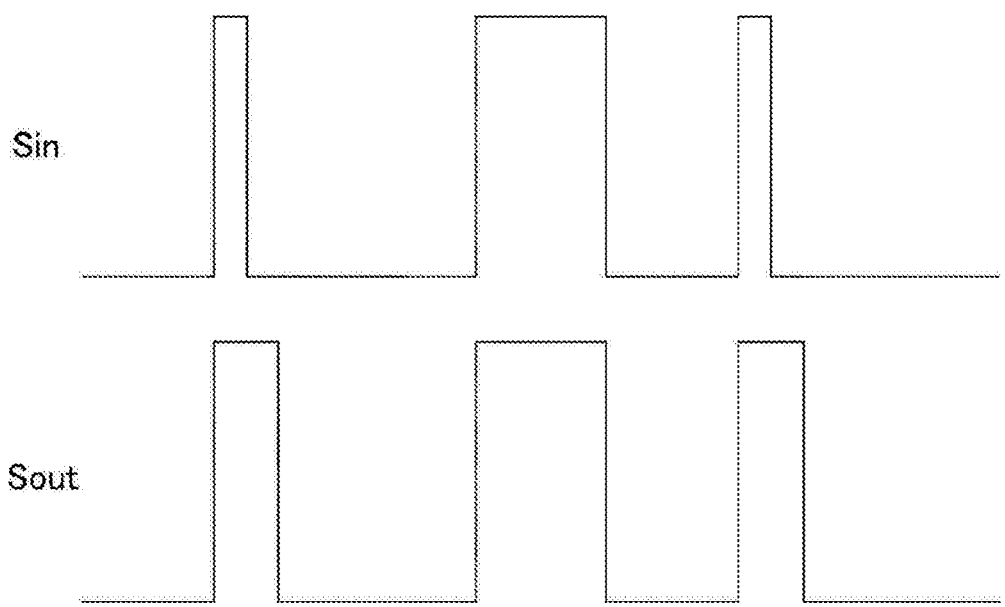
FIG. 10 is a drawing showing one example of waveforms of input-output signals of a first circuit and a second circuit in a signal regenerating unit according to an embodiment of the present disclosure.

FIG. 10 is a drawing showing one example of the waveforms of the input signal Sin and the output signal Sout of the first circuit 110 and the second circuit 120 of the signal regenerating units 100A and 100B. Furthermore, the circuit structures of the first circuit 110 and the second circuit 120 of the signal regenerating units 100A and 100B are the same with one another; therefore, the input-output characteristics of the first circuit 110 and the second circuit 120 are the same with one another.

As shown in FIG. 10, the signal regenerating units 100A and 100B according to the third embodiment of the present disclosure increases the pulse width of a pulse included in the input signal Sin of which a width is smaller than a prescribed magnitude, and does not change the pulse width of a pulse included in the input signal Sin of which a width is greater than a prescribed magnitude. In the battery monitoring system, there are cases in which multiple kinds of signals having different pulse widths are used. According to the signal regenerating units 100A and 100B of the third embodiment of the present disclosure, for the pulse of which the width is smaller than a prescribed magnitude, the pulse width is extended, and for the pulse of which the width is greater than a prescribed magnitude, the pulse width is not changed, so that the signal regenerating units 100A and 100B of the embodiment can be applied to the battery monitoring system in which multiple kinds of signals having different pulse widths are used.

Fourth Embodiment

Figure 11:
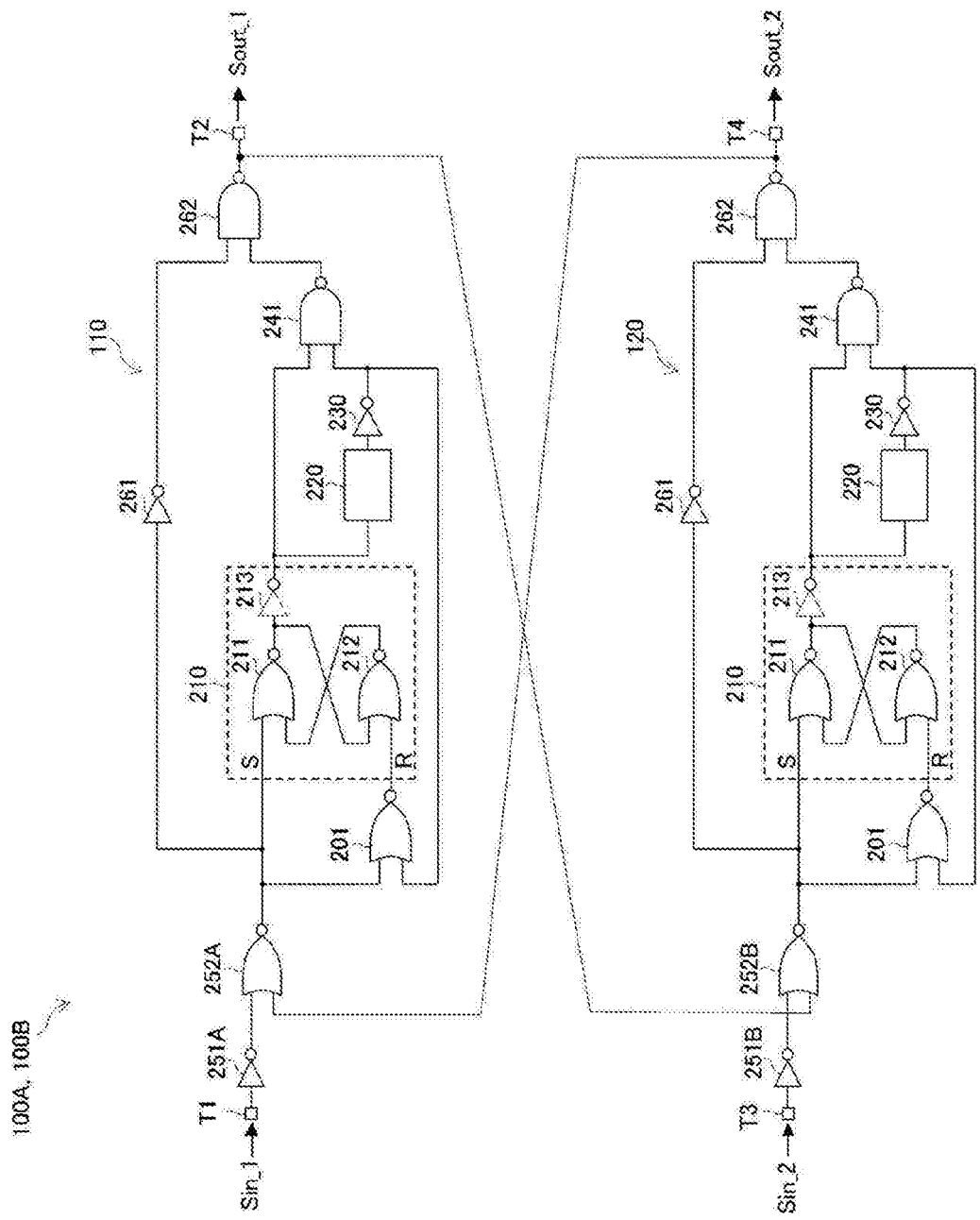
FIG. 11 is a drawing showing one example of a structure of a signal regenerating unit according to another embodiment of the present disclosure.

FIG. 11 is a drawing showing one example of structures of the signal regenerating units 100A and 100B according to a fourth embodiment of the present disclosure. The signal regenerating units 100A and 100B according to the fourth embodiment of the present disclosure are different from the signal regenerating units 100A and 100B according to the second embodiment in that, a NOT circuit 261 and a NAND circuit 262 are added in the first circuit 110 and the second circuit 120, and the AND circuit 240 shown in FIG. 7 is replaced with a NAND circuit 241.

According to the signal regenerating units 100A and 100B of the fourth embodiment of the present disclosure, similar to the signal regenerating unit 100A and the signal regenerating unit 100B of the second embodiment, partially overlapping between the pulse of the output signal Sout_1 of the first circuit 110 and the pulse of the output signal Sout_2 of the second circuit 120 can be avoided and a decline in the correction effect to the pulse width by the signal regenerating unit 100A and the signal regenerating unit 100B can be avoided. In addition, according to the signal regenerating units 100A and 100B of the fourth embodiment of the present disclosure, similar to the signal regenerating unit 100A and the signal regenerating unit 100B of the third embodiment, for the pulse of which the width is smaller than a prescribed magnitude, the pulse width is extended, and for the pulse of which the width is greater than a prescribed magnitude, the pulse width is not changed, so that the signal regenerating units 100A and 100B of the embodiment can be applied to the battery monitoring system in which multiple kinds of signals having different pulse widths are used.

Fifth Embodiment

Figure 12:
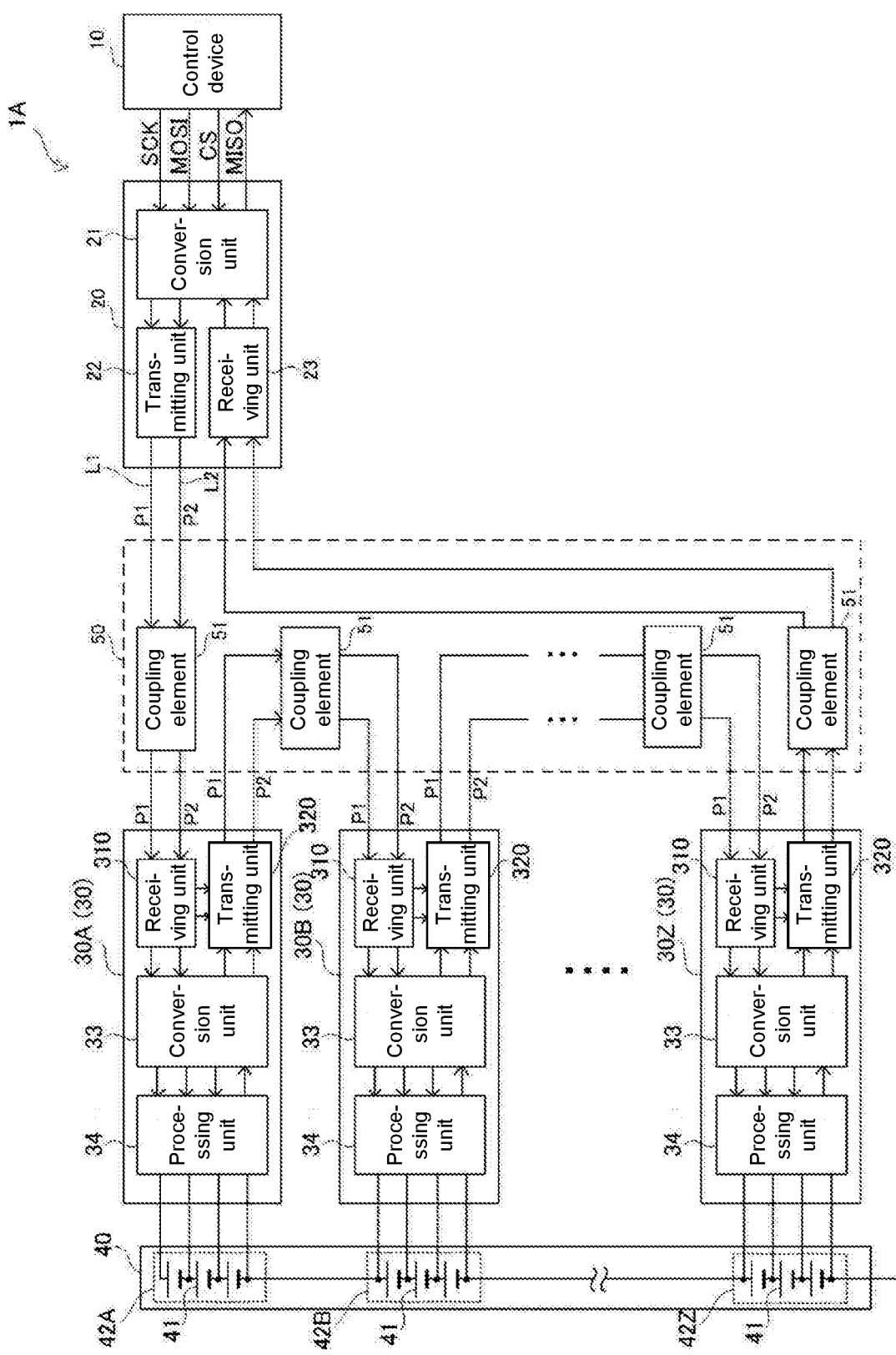
FIG. 12 is a drawing showing a structure of a battery monitoring system according to another embodiment of the present disclosure.

FIG. 12 is a drawing shown a structure of a battery monitoring system 1A according to a fifth embodiment of the present disclosure. The battery monitoring system 1A is different from the battery monitoring system 1 according to the first embodiment in the communication paths between the battery monitoring devices 30 and between the battery monitoring devices 30 and the signal converting device 20. In addition, in the battery monitoring device 30 according to the embodiment, the transceiving unit 31 shown in FIG. 1 is replaced with a receiving unit 310 dedicated for reception, and the transceiving unit 32 shown in FIG. 1 is replaced with a transmitting unit 320 dedicated for transmission.

In the battery monitoring device 30, except the battery monitoring device 30Z arranged on a lowest potential side, the transmitting unit 320 is connected to the receiving unit 310 of the adjacent battery monitoring device 30 on the low potential side through the transmission path 50. That is, multiple battery monitoring devices 30 are connected in series so as to form a daisy-chain, and are capable of communicating between the other adjacent battery monitoring device 30. In the battery monitoring system 1A according to the embodiment, the communication between battery monitoring devices 30 adjacent to one another is a one-way communication from the high potential side to the low potential side of the daisy-chain.

The receiving unit 310 of the battery monitoring device 30A arranged on the highest potential side is connected to the transmitting unit 22 of the signal converting device 20 through the transmission path 50. The transmitting unit 320 of the battery monitoring device 30Z arranged on the lowest potential side is connected to the receiving unit 23 of the signal converting device 20 through the transmission path 50.

Figure 13:
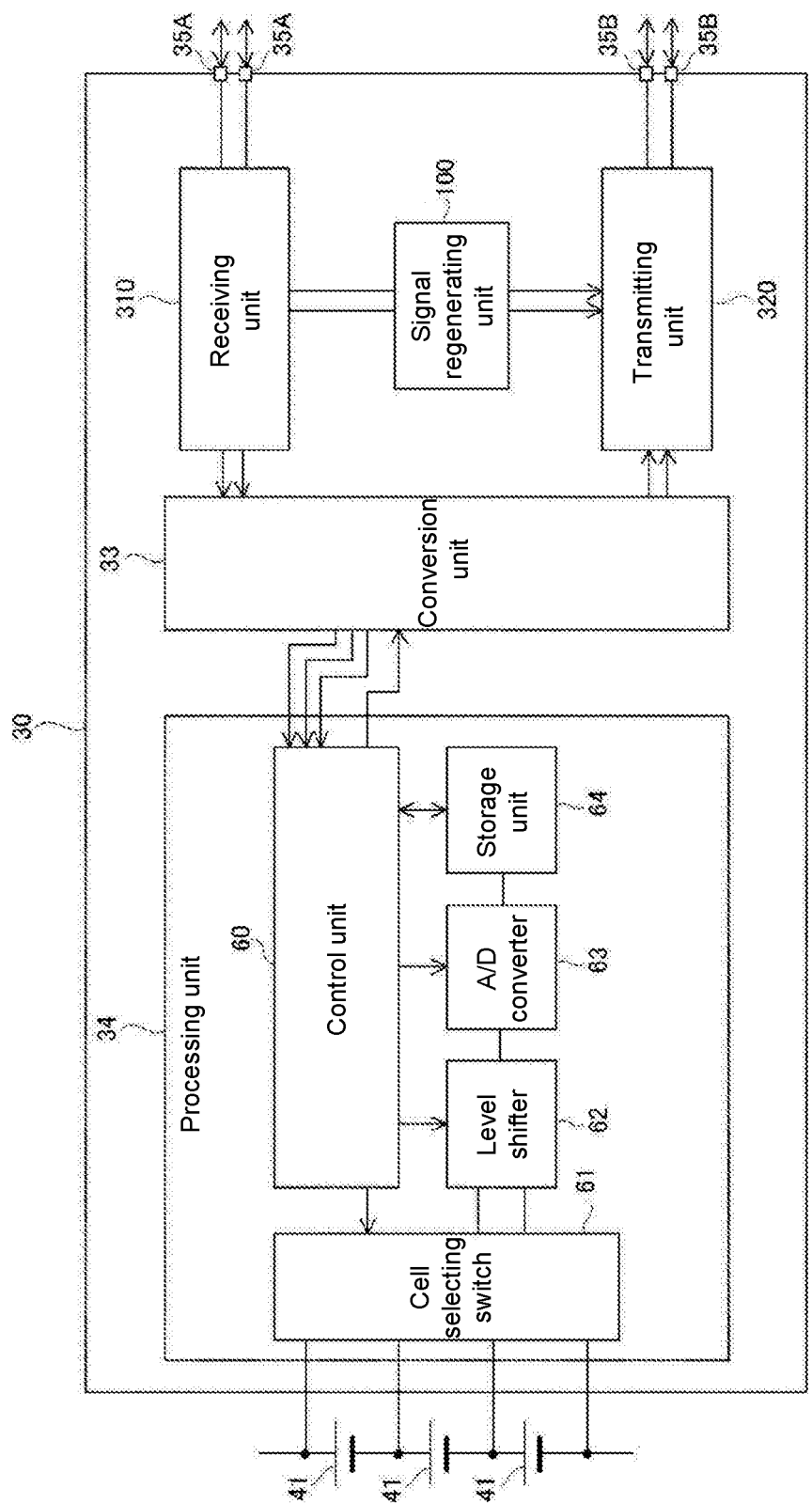
FIG. 13 is a drawing showing a structure of a battery monitoring device according to another embodiment of the present disclosure.

FIG. 13 is a drawing showing a structure of the battery monitoring device 30 applied to the battery monitoring system 1A according to the embodiment.

The receiving unit 310 is connected to the communication port 35A, and the transmitting unit 320 is connected to the communication port 35B. The signal regenerating unit 100 is provided between the receiving unit 310 and the transmitting unit 320.

The receiving unit 310 receives the communication signal of the differential format input to the communication port 35A, and supplies the received communication signal to the conversion unit 33 and the signal regenerating unit 100.

The transmitting unit 320 sends the communication signal of differential format supplied from the conversion unit 33 and the regenerated communication signal supplied from the signal regenerating unit 100 to the transmission path 50 through the communication port 35B.

The signal regenerating unit 100 regenerates the communication signal so that the width of the pulse included in the communication signal which is supplied from the receiving unit 310 becomes a prescribed magnitude, and supplies the regenerated communication signal to the transmitting unit 320. Any one of the structures shown in FIG. 3, FIG. 7, FIG. 9, and FIG. 11 can be applied as a structure of the signal regenerating unit 100.

According to the battery monitoring system 1A of the embodiment, the communication signal transmitted from the control device 10 to each battery monitoring device 30 is sequentially transmitted from the battery monitoring device 30 arranged on the high potential side to the battery monitoring device 30 arranged on the low potential side until being transmitted to the battery monitoring device 30Z on the final stage. When the communication signal passes through the multiple monitoring devices 30, the communication signal is regenerated by the signal regenerating unit 100 and the pulse width is corrected.

In addition, according to the battery monitoring system 1A of the embodiment, the communication signal transmitted from each battery monitoring device 30 to the control device 10 is sequentially transmitted from the battery monitoring device 30 arranged on the high potential side to the battery monitoring device 30 arranged on the low potential side until being transmitted to the battery monitoring device 30Z on the final stage, then sent to the transmission path 50 from the transmitting unit 320 of the battery monitoring device 30Z, and transmitted to the control device 10 passing through the signal converting device 20. When the communication signal passes through the multiple monitoring devices 30, the communication signal is regenerated by the signal regenerating unit 100 and the pulse width is corrected.

What is claimed is:

1. A battery monitoring device, comprising:
    a receiving unit, which receives a communication signal input from the outside;
    a signal regenerating unit, which regenerates the communication signal to make a width of a pulse that is included in the communication signal received by the receiving unit become a prescribed magnitude;
    a transmitting unit, which transmits the communication signal regenerated by the signal regenerating unit to the outside; and
    a processing unit, which carries out a process of measuring a cell voltage of battery cells according to the communication signal received by the receiving unit, wherein
    the communication signal is a differential signal including a first pulse train and a second pulse train, and
    the signal regenerating unit comprises:
    a first circuit, which regenerates the first pulse train to make a width of a pulse that is included in the first pulse train received by the receiving unit become a prescribed magnitude; and
    a second circuit, which regenerates the second pulse train to make a width of a pulse that is included in the second pulse train received by the receiving unit become a prescribed magnitude.

2. The battery monitoring device according to claim 1, wherein
    the first circuit generates a regenerated pulse corresponding to a voltage level of the pulse regenerated by the second circuit; and
    the second circuit generates the regenerated pulse corresponding to a voltage level of the pulse regenerated by the first circuit.

3. The battery monitoring device according to claim 1, wherein
    the signal regenerating unit increases a width of a pulse which is included in the communication signal received by the receiving unit and has a width smaller than a prescribed magnitude, but does not change a width of a pulse which is included in the communication signal receive by the receiving unit and has a width greater than a prescribed magnitude.

4. The battery monitoring device according to claim 1, wherein
    the signal regenerating unit comprises:
    a latch circuit, which keeps the signal received by the receiving unit and outputs a kept signal value;
    a delay circuit, which outputs a delay signal obtained by delaying the output signal of the latch circuit; and
    a logic circuit, which outputs a logic operation result of the output signal of the latch circuit and a signal obtained by a logic inversion of the output signal of the delay circuit.

5. A battery monitoring system, comprising a plurality of battery monitoring devices connected in series and each of which has a function of monitoring battery cells and being capable of communicating between the battery monitoring devices adjacent to one another,
    wherein each of the plurality of battery monitoring devices comprises:

a receiving unit, which receives a communication signal input from the outside;
a signal regenerating unit, which regenerates the communication signal to make a width of a pulse that is included in the communication signal received by the receiving unit become a prescribed magnitude;
a transmitting unit, which transmits the communication signal regenerated by the signal regenerating unit to the outside; and
a processing unit, which carries out a process of measuring a cell voltage of the battery cells according to the communication signal received by the receiving unit, wherein
the communication signal is a differential signal including a first pulse train and a second pulse train, and
the signal regenerating unit comprises:
a first circuit, which regenerates the first pulse train to make a width of a pulse that is included in the first pulse train received by the receiving unit become a prescribed magnitude; and
a second circuit, which regenerates the second pulse train to make a width of a pulse that is included in the second pulse train received by the receiving unit become a prescribed magnitude.

6. The battery monitoring system according to claim 5, wherein the transmitting unit of one of the plurality of battery monitoring devices is connected to the receiving unit of another adjacent battery monitoring device.

7. The battery monitoring system according to claim 5, further comprising:
a control device, which is communicatively connected to each of the plurality of battery monitoring devices; and
a signal converting device, which converts a signal format of the communication signal transmitted and received between the battery monitoring device and the control device.

8. The battery monitoring system according to claim 7, wherein the signal converting device is connected to the receiving unit of a battery monitoring device arranged on one end of the plurality of battery monitoring devices, and to the transmitting unit of a battery monitoring device arranged on an other end of the plurality of battery monitoring devices.

9. A battery monitoring system, comprising a plurality of battery monitoring devices connected in series and each of which has a function of respectively monitoring battery cells, and being capable of communicating between the battery monitoring devices adjacent to one another, wherein
each of the plurality of battery monitoring devices comprises:
a first receiving unit and a second receiving unit, which respectively receive a communication signal input from the outside;
a first signal regenerating unit, which regenerates the communication signal to make a width of a pulse that is included in the communication signal received by the first receiving unit become a prescribed magnitude;
a second signal regenerating unit, which regenerates the communication signal to make a width of a pulse that is included in the communication signal received by the second receiving unit become a prescribed magnitude;
a first transmitting unit, which transmits the communication signal regenerated by the first signal regenerating unit to the outside;
a second transmitting unit, which transmits the communication signal regenerated by the second signal regenerating unit to the outside; and
a processing unit, which carries out a process of measuring a cell voltage of the battery cells according to the communication signal received by the first receiving unit or the second receiving unit, wherein
the communication signal is a differential signal including a first pulse train and a second pulse train, and
each of the first signal regenerating unit and the second signal regenerating unit comprises:
a first circuit, which regenerates the first pulse train to make a width of a pulse that is included in the first pulse train received by the first receiving unit or the second receiving unit become a prescribed magnitude; and
a second circuit, which regenerates the second pulse train to make a width of a pulse that is included in the second pulse train received by the first receiving unit or the second receiving unit become a prescribed magnitude.

10. The battery monitoring system according to claim 9, wherein
the first transmitting unit and the second receiving unit of one of the plurality of battery monitoring devices are connected to the first receiving unit and the second transmitting unit of another adjacent battery monitoring device.

11. The battery monitoring system according to claim 10, further comprising:
a control device, which is communicatively connected to each of the plurality of battery monitoring devices; and
a signal converting device, which converts a signal format of a communication signal transmitted and received between the battery monitoring device and the control device.

12. The battery monitoring system according to claim 11, wherein
the signal converting device is connected to the first receiving unit and the second transmitting unit of a battery monitoring device arranged on one end of the plurality of battery monitoring devices.

* * * * *